US005168096A

United States Patent [19]

Tournier

[11] Patent Number: 5,168,096

[45] Date of Patent: Dec. 1, 1992

[54] METHOD FOR PREPARING AN ORIENTED AND TEXTURED MAGNETIC MATERIAL

[75] Inventor: Robert Tournier, Bilieu, France

[73] Assignee: Centre National de la Recherche Scientifique, Paris, France

[21] Appl. No.: 673,654

[22] Filed: Mar. 21, 1991

[30] Foreign Application Priority Data

Mar. 22, 1990 [FR] France .............................. 90 03922

[51] Int. Cl.[5] .............................................. C30B 11/14

[52] U.S. Cl. ........................................ 505/1; 505/729; 156/616.1; 156/616.3; 156/616.41; 23/301

[58] Field of Search .................. 156/600, 616.1, 616.3, 156/616.41, 624; 210/695, 737; 23/361 R, 365 F; 505/1, 729

[56] References Cited

U.S. PATENT DOCUMENTS

| | | | |
|---|---|---|---|
| 3,279,602 | 10/1966 | Kottenstettle et al. | 210/695 |
| 3,672,872 | 6/1972 | Bonnier et al. | 210/695 |
| 4,539,040 | 9/1985 | Mawardi | 210/695 |

FOREIGN PATENT DOCUMENTS

| | | | |
|---|---|---|---|
| 657098 | 2/1963 | Canada | 23/305 F |
| 57-184572 | 11/1982 | Japan . | |
| 977596 | 12/1964 | United Kingdom . | |

OTHER PUBLICATIONS van Kleef et al., "Continuous Flow Separation an Application of Selective Magnetosedimentation," *Journal de Physique*, Jan. 1984, pp. C1-763-C1-766.

Viehr, "Production of Single Crystals of Manganese Ferrites By the Verneuil . . . ", Confrence Growth of Crystal, Moscow U.S.S.R. Jul. 1966, pp. 239-243.

*Primary Examiner*—Robert Kunemund

*Attorney, Agent, or Firm*—Lowe, Price, LeBlanc & Becker

[57] ABSTRACT

A method for preparing an oriented and textured magnetic compound, comprising the steps of preparing a composition at a temperature such that it comprises crystallites of the compound in the presence of a liquid; subjecting the composition to a magnetic force producing crystallite sedimentation; cooling down the composition in the presence of a magnetic force while applying a suitable temperature gradient for improving the development of a desired texture in the sedimentation area.

10 Claims, 3 Drawing Sheets

METHOD FOR PREPARING AN ORIENTED AND TEXTURED MAGNETIC MATERIAL

BACKGROUND OF THE INVENTION

The present invention relates to a method for preparing an oriented and textured material.

It applies especially to the preparation of magnetic materials designed to form "soft" or "hard" magnets or high temperature superconductors.

More particularly, the invention provides a method for preparing in a vessel an oriented and textured magnetic material using, in combination:

an orientation effect, caused by a magnetic field, of the seeds or crystallites of the material it is desired to manufacture, this material being in a molten state or dispersed in a molten compound;

a sedimentation effect caused by a magnetic force in order that, during their formation, the seeds or crystallites of the desired material gather in a same area of the vessel, generally at the bottom, causing a purification action since the various parasitic particles liable to exist in the molten mass or in the dispersion and which present a magnetic susceptibility different from that of the desired material are not attracted with the same efficiency as the desired material; and a texturation effect associated with the creation of a temperature gradient in the area where the sedimentation occurs, in order to improve an aggregation or solidification according to the growth axes of the desired material, to obtain it as a single crystal or oriented crystallites.

Before explaining in more detail the invention, a few general magnetization laws, the invention makes use of, will be reminded.

First, magnetic materials have a magnetic susceptibility X which is generally anisotropic. For example, there are materials that have an axis of easy magnetization, hereinafter called axis c, the two other axes being axes a and b. Thus, if X is the magnetic susceptibility, the difference in magnetic susceptibility between the axis of easy magnetization (c) and the hard directions (a and b), is:

$$\Delta X = X_c - X_{ab}$$

If a magnetic field B is applied, particles tend to be oriented according to their axis of easy magnetization and an energy gain .E is produced with respect to the case of a material with a random distribution of the magnetic axes:

$$\Delta E = V.B^2.\Delta X/2\,\mu_0$$

where V is the volume considered and $\mu_0 = 4\pi.10^{-7}$ in international units (I.U.).

If it is desired to orientate a magnetic material in a field, this energy gain ΔE must be substantially higher than the energy associated with the thermal agitation, namely, kT, where T is the absolute temperature and k the Boltzmann's constant.

The result of this comparison gives the definition of volumes or elementary domains liable to be satisfactorily oriented. For example, for a $YBa_2Cu_3O_7$ grain of 1 $\mu m^3$, which constitutes a high temperature superconductor, ΔX will be about $10^{-5}$ I.U. which gives $\Delta E/kT = 10^4$ at T=1500° K. and for B=5 teslas, that is, $\Delta E > kT$. But, $\Delta E/kT$ is equal to 10 only if the grain size decreases to $10^{-3}\ \mu m^3$.

The simplest case of uniaxial anisotropy will be considered here. However, it is known that some magnetic materials may have several equivalent axes of easy magnetization and even an easy magnetization plane. This magnetic anisotropy may be very high when the material is magnetically ordered, particularly when it is ferromagnetic. In the paramagnetic state, the magnetic anisotropy is very low but often sufficient for alignment under a magnetic field.

On the other hand, when considering the magnetic force applied to a material in the case of an induction B with a gradient dB/dz, the product B.dB/dz being about 500 $T^2/m$, it can be demonstrated that a rare earth (R) compound of the $RBa_2Cu_3O_7$ type, will be subjected at 1500° K. to a force of about 7 times gravity if R is dysprosium or erbium, and about 0.5 time gravity if R is neodymium. A compound of the $Nd_2Fe_{14}B$ type will be subjected at 1500° K. to a force equal to 30 times gravity and, at the eutectic solidification temperature, at about 1000° K., to a force equal to 50 times gravity. These orders of magnitude show that the sedimentation effects associated with the presence of a magnetic force on a magnetic material ensure performances substantially equal to those obtained with centrifuging techniques.

The principles reminded above are intended to call back to mind the orientation effect that can be obtained by the application of a magnetic field, and the sedimentation effects that may result from the application of a magnetic force.

Moreover, it is known that, in order to facilitate the solidification of a material according to its preferential growth axis or plane, it is desirable to apply, during cooling down, a temperature gradient in the direction of this growth axis or plane. In practice, this means that, in case of a material under solidification placed in a vessel, and sedimenting on the lower portion of this vessel, the bottom or the walls of this vessel during solidification are preferably cooled down.

SUMMARY OF THE INVENTION

Thus, the invention provides a method for preparing an oriented and textured material, comprising the following steps:

a) preparing a composition at a temperature such that it comprises crystallites of the material in the presence of a liquid, b) subjecting the composition to a magnetic force producing sedimentation of crystallites, c) cooling down in the presence of a magnetic force while applying a suitable temperature gradient for improving the development of a desired texture in the sedimentation area.

According to a first variant of the invention, the crystallites of step a) originate from single-crystal particles of the desired magnetic material, that are mixed with a second material, the melting temperature and magnetic susceptibility of which are lower than that of the desired material, the composition being heated at a temperature higher than the melting temperature of the second material and lower than, but close to, the melting temperature of the desired magnetic material.

According to a second variant of the invention, step a) is achieved by using the desired magnetic material in bulk form and heating this material up to liquid state without overheating, so that there remains numerous small-size seeds of the desired material.

According to a third variant of the invention, step a) consists in using the desired magnetic material in solid state, then heating it at a temperature higher than its melting point and slowly cooling down until the first seeds of the material appear.

According to a fourth variant of the invention, step a) comprises the steps consisting in using a combination of materials comprising solid particles constitutive of the desired magnetic material but which have not yet reacted, these particles being in suspension in a non-reactive liquid, the whole compound being heated at a temperature lower than the melting temperature of said constitutive particles.

BRIEF DESCRIPTION OF THE DRAWINGS

The foregoing and other objects, features and advantages of the invention will be apparent from the following detailed description of preferred embodiments as illustrated in the accompanying figures wherein.

DETAILED DESCRIPTION OF THE INVENTION

Figure 1:
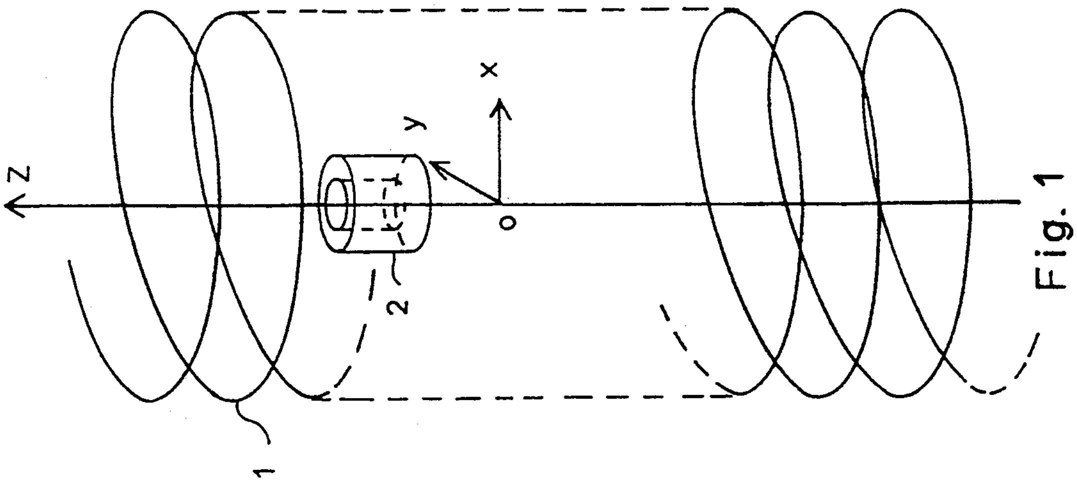
FIG. 1 very schematically illustrates a device implementing the method according to the invention.

FIG. 1 very schematically illustrates a device for implementing the method according to the invention. This device comprises a coil 1. A system of Cartesian coordinates (x, y, z), has its origin at the center of the coil. Coil 1 is arranged so that its axis, which corresponds to axis z of the reference axes, is oriented according to the gravity field, this orientation being hereafter called "vertical".

A crucible 2 is placed in coil 1 so that its axis is substantially in coincidence with the axis of the coil. Crucible 2 can be moved vertically and is made of a non-magnetic material. An oven (not shown) is provided inside the coil and surrounds the crucible.

Figure 2:
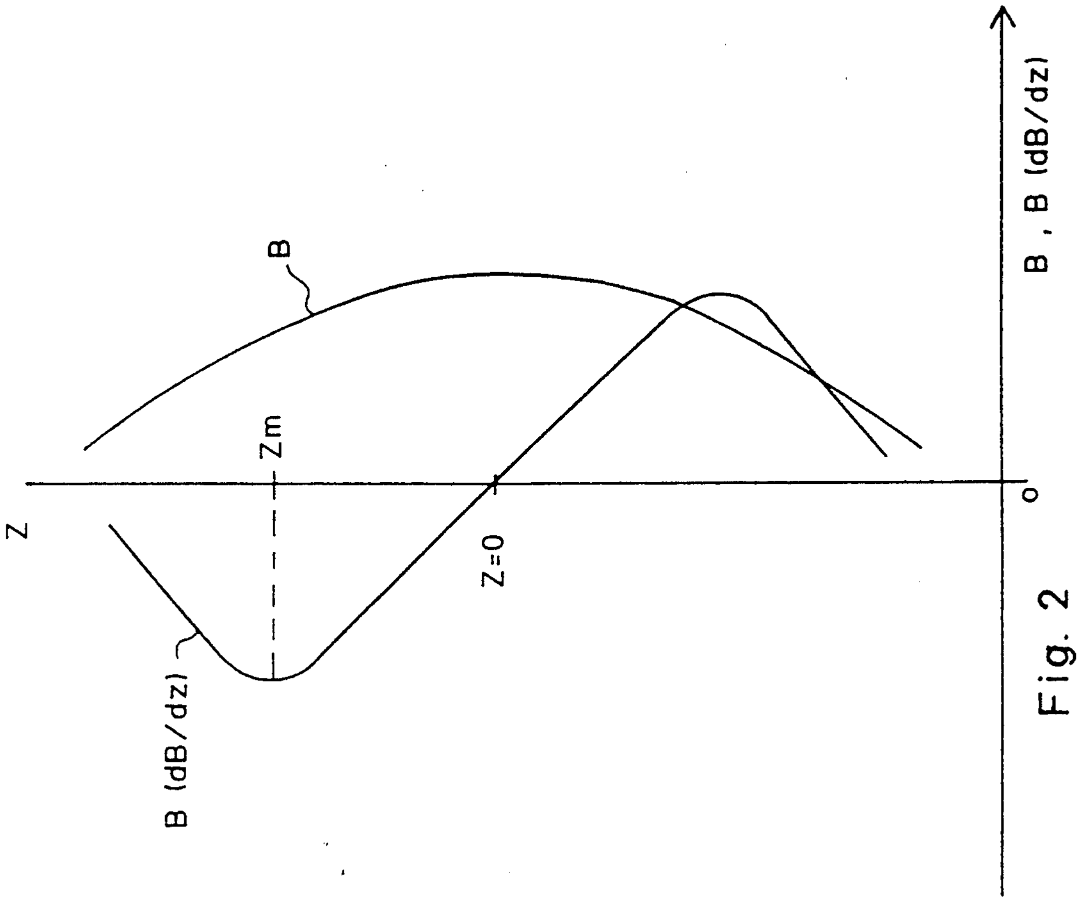
FIG. 2 illustrates the distribution of the magnetic field and magnetic force in a coil such as that of FIG. 1.

FIG. 2 shows the intensity B of the induction on axis z as a function of height z when a current flows in coil 1. The induction is maximum for z=0 and it progressively decreases as the absolute value of z increases. Then, there exists on the coil axis, for values of z different from zero, on the one hand, a magnetic induction B and, on the other hand, a magnetic induction gradient dB/dz.

If a magnetic material with a magnetic susceptibility X is placed in the crucible 2, it will be subjected, in accordance with electromagnetic laws, to a force $(X/\mu_0).B.dB/dz$ ($\mu_0=4\pi\times10^{-7}$ in International Units). The curve representing B.dB/dz is also represented in FIG. 2 as a function of the position z on the coil axis. The induction is always positive. For values of z higher than zero, induction increases as z departs from zero and the induction gradient is negative. B.dB/dz and thus the magnetic force $(X/\mu_0).B.dB/dz$ are therefore negative since the magnetic susceptibility is positive. They reach a maximum value for a position $z=z_m$ corresponding to the maximum slope region of the induction curve.

In the selected reference system, weight is negative. Thus, the magnetic force $(X/\mu_0).B.dB/dz$ is added to the weight when the force is negative, that is, for values of z higher than zero. For example, one uses a superconductive coil with multifilaments of niobium-titanium (NbTi) and niobium-tin ($Nb_3Sn$) for generating a high magnetic induction of about 12 teslas. The internal diameter of the coil is selected in this particular case slightly higher than one tenth of a meter (0.15 m). The value of the product B.dB/dz varies from zero for z=0 to a value of 500 $T^2/m$ for a height z of about 0.1 m (0.08 m) for a coil placed in a ring-shaped cryostat (not shown) letting a free cylinder with a diameter equal to 0.1 m at normal temperature.

If crucible 2 is vertically movable, it is possible either to apply a magnetic field with a magnetic force substantially null at the neighbourhood of z=0 or to apply a field and a substantial magnetic force at the neighbourhood of $z=z_m$.

EXAMPLE 1

Preparation of NdFeB

An embodiment of the invention is described hereafter according to its four variants for obtaining a compound such as NdFeB, which is a material used to form permanent magnets. This material combines both a very high coercivity and a very high magnetic energy. To increase coercivity, the material must be constituted by small-size $Nd_2Fe_{14}B$ crystallites, the c axis of which is oriented so as to provide the highest possible remanent induction.

EXAMPLE 1

Variant 1

One starts from powder mixture of an alloy of NdFeB, available on the market, with a typical composition (in atoms %) 77 Fe, 15.3 Nd, 7.7 B, and an eutectic $Nd_3Fe$ alloy, so that the atom proportion of neodymium in the mixture is about 40%.

Figure 3A:
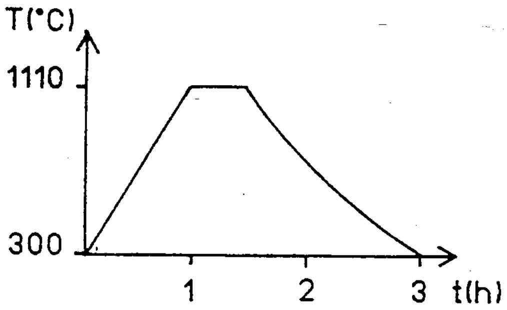
FIGS. 3A–3D illustrate embodiments of each of the four variants of the invention for preparing $Nd_2Fe_{14}B$.

As shown in FIG. 3A, the mixture is first heated from 300° C. to 1,110° C. The $Nd_3Fe$ eutectic is liquid from 700° C. while $Nd_2Fe_{14}B$ is not fully dissolved in the eutectic at 1,100° C. Preferably, this step is achieved in an inert atmosphere. Then, a field is applied for orienting the $Nd_2Fe_{14}B$ crystallites, and the crucible is moved to the area corresponding to abscissa $z_m$ for sedimenting the $Nd_2Fe_{14}B$ crystallites that remain oriented and accumulate at the bottom of the crucible to form $Nd_2Fe_{14}B$ grains with $Nd_3Fe$ as grain boundaries. The largest part of $Nd_3Fe$ being located at the surface of the crucible. Then, a cooling down phase, liable to be relatively rapid, for example 90 minutes as indicated in FIG. 3A, is carried out. Once the solid material is obtained, the lower portion ($Nd_2Fe_{14}B$) can be sawn off from the upper portion ($Nd_3Fe$ and impurities).

EXAMPLE 1

Variant 2

In this variant, one starts from a common cast NdFeB alloy available on the market, having a typical composition (in atoms %) 77 Fe, 15.3 Nd, 7.7 B, so that the $Nd_2Fe_{14}B$ compound is in presence of an excess of $Nd_3Fe$ eutectic (about 10%).

Figure 3B:
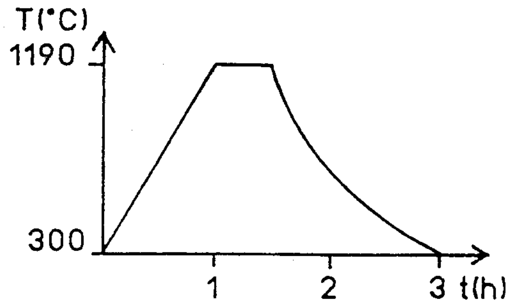

As shown in FIG. 3B, the composition contained in the crucible 2 is heated at a temperature ranging from 1,170° C. to 1,185° C., that is, a temperature higher than the melting temperature of $Nd_2Fe_{14}B$, but without overheating, whereby there remains some seeds constituted by $Nd_2Fe_{14}B$ crystallites.

Under the effect of the magnetic field, these seeds are oriented and, because of the application of a magnetic force, they are sedimented on the bottom of the crucible.

While cooling down, these seeds progressively accumulate. The oven containing the crucible is built up so that cooling is established from the periphery towards the core. Thus, the desired material having an oriented structure with a vertical c axis is obtained. Moreover, it will be noted that this method has the advantage of leaving possible impurities at the surface of the composition as the material cools down (the same phenomenon would occur in the other variants of the method described here).

EXAMPLE 1

Variant 3

The same initial mixture as in variant 2 is used.

Figure 3C:
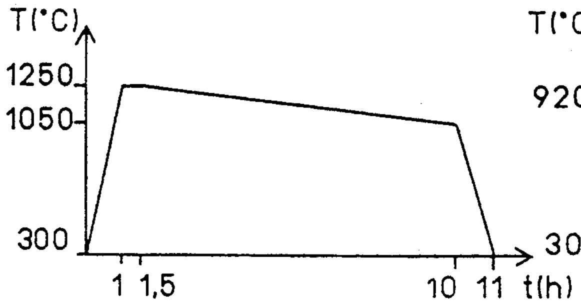

The thermal cycle is illustrated in FIG. 3C. The material is heated beyond the melting temperature in order to generate overheating and to eliminate seeds. Then, the material is slowly cooled down to 1,050° C. under a magnetic force, for example at a rate of 20° C. per hour for directionally solidifying the sedimented material at the bottom of the crucible. Moreover, a horizontal temperature gradient is imposed from the periphery towards the center of the crucible for directionally and progressively solidifying the material from the periphery towards the core. The application of a magnetic force HdH/dz caused the possible γ-iron residues to move towards the surface of the liquid. After solidification, α-iron traces are found at the surface of the solidified ingot, $Nd_2Fe_{14}B$ crystallites being oriented according to the vertical c axis.

EXAMPLE 1

Variant 4

In this case, one starts from thin powders of $Fe_3Nd$, $Fe_2B$ and iron eutectic according to the minimum proportion of 15.3 $Fe_3Nd$, 7.7 $Fe_2B$, 15.8 Fe with a $Fe_3Nd$ eutectic excess.

Figure 3D:
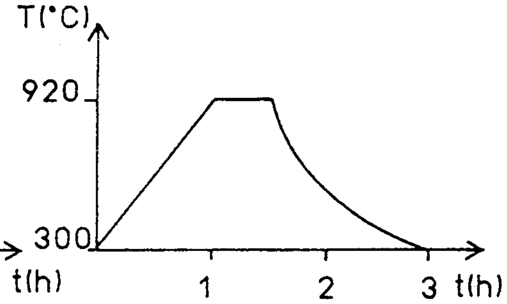

As shown in FIG. 3D, the compound is heated at a temperature of 920° C. for one hour under a field of about 1 tesla, for example, for obtaining oriented crystallites with a size of the order of 1 μm and having a high coercive field. Cooling down in oven with HdH/dz of about 10 $T^2/m$ permits sedimenting $Nd_2Fe_{14}B$ and providing excess eutectic at the surface, wherefrom it is then possible to eliminate it. Thus, an element constituted by oriented particles with a size of about 1 μm and a high coercive field is obtained.

EXAMPLE 2

Production of Permanent Magnet $Sm_2T_{17}$

Here is considered the production of permanent magnets, the general formula of which is $Sm_2T_{17}$, where T corresponds to a mixture of metals of the transition series (iron and zirconium series). For example, one will consider $Sm_x$-$Co_y$-Cu(7% in atoms)-Fe(22% in atoms) Zr(2% in atoms) where x ranges from 11 to 12% and y from 58 to 57%. These compounds have a Curie temperature close to 1,200° K. and an axis of easy magnetization corresponding to axis c of the crystallographic structure.

This compound can be prepared by using the variant 2 of the method according to the invention.

Figure 4:
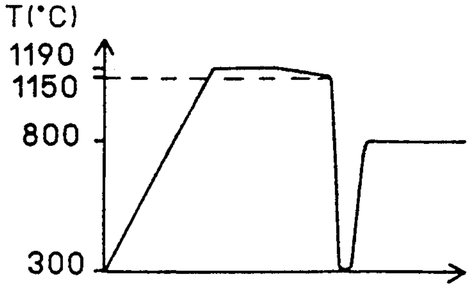
FIG. 4 illustrates an embodiment of the second variant of the invention for preparing $Sm_2T_{17}$.

As shown in FIG. 4, the sample is annealed at 1,190° C. for 30 minutes under HdH/dz = 10 $T^2/m$. Then, it is cooled from 1,190° C. down to 1,150° C. under the same magnetic force. During the cooling phase, the $Sm_2T_{17}$ compound particles, entrained by the magnetic force, deposit at the bottom of the crucible as they appear. The liquid is enriched with samarium. When a 1,150° C. temperature is reached, a rapid cooling is carried out and can be followed by annealing for a few hours at 800° C. so as to improve the coercive field.

The magnetic force permits sedimenting the desired compound while it appears during the cooling down phase and facilitates sintering of the $Sm_2T_{17}$ phase with an oriented structure. The excess $SmT_5$ phase is expulsed during sintering and remains concentrated above $Sm_2T_{17}$ because its susceptibility is lower than that of $Sm_2T_{17}$. Samarium oxides will float at the surface because their susceptibility is much lower than that of the other elements.

EXAMPLE 3

Production of $RBa_2Cu_3O_{7-\delta}$

Now, the production of some low-temperature superconductor materials, having at high temperature an anisotropic magnetic susceptibility, will be considered.

In order to obtain high critical currents, materials must be so textured that currents flow along planes ab of the crystallographic structure rather than along the c axis.

More particularly, the formation of compounds of the $RBa_2Cu_3O_{7-\delta}$ type, where R is a rare earth or a mixture of rare earths, will be considered. The magnetic susceptibility of these compounds is maximum according to axis c in cases such as that of $RBa_2Cu_3O_{7-\delta}$ or in the plan ab in cases such as $ErBa_2Cu_3O_{7-\delta}$. In these compounds, the crystal growth is maximum in the direction of planes ab.

Two cases can therefore be encountered for the orientation of the field with respect to the temperature gradient ΔT.

If the axis of easy magnetization is parallel to axis c, ΔT is horizontal and the field is vertical. For example, it will be possible, in a vertical oven, to use the natural oven radial gradient which occurs as soon as cooling starts.

For a plane of easy magnetization parallel to ab, one will select a configuration such as ΔT is parallel to the vertical axis. It will be possible, for example in a vertical oven, to move the sample according to the vertical axis so as to vertically move the solid-liquid interface.

Implementation of the invention to compounds of the $RBa_2Cu_3O_7$ type will now be described according to its four variants.

EXAMPLE 3

Variant 1

One starts from $RBa_2Cu_3O_7$ crystallites, oriented or non-oriented at ordinary temperature, these particles are mixed to silver oxide power (30 to 40%) then cold-pressed under about 200 MPa.

Figure 5A:
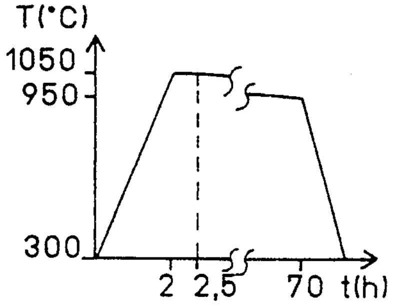
FIGS. 5A–5D respectively illustrate embodiments of each of the four variants of the invention for preparing $RBa_2Cu_3O_7$.

As shown in FIG. 5A, the mixture is placed in a crucible and heated at 1,050° C. for 30 minutes in a uniform field of several teslas. The initial mixture is not entirely molten, the silver oxide only being fused.

The crucible 2 is then moved to the maximum magnetic force position to achieve sedimentation of the desired compound. Then, the crucible is slowly cooled down, for example by about 1° C. per hour to a temperature (950° C.) lower than the solidification temperature of silver; afterwards, it can be cooled down more rapidly.

As a result, solid $RBa_2Cu_3O_{7-\delta}$ is obtained at the bottom of the crucible. Excess silver moves on top of the superconductor. Parasitic phases such as barium carbonate and copper oxide appear over the silver surface.

EXAMPLE 3

Variant 2

Figure 5B:
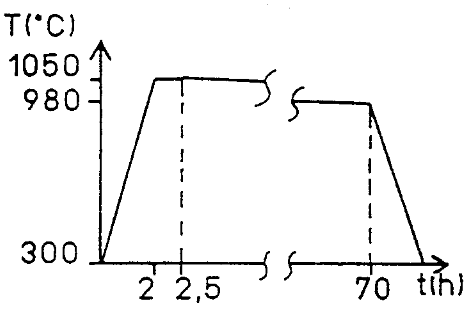

The same initial product as in the case of variant 1 is used but without silver. Then, the step of FIG. 5B is achieved, that is, roughly the same step as that of FIG. 5A but with higher stages, so that the desired compound melts without overheating.

EXAMPLE 3

Variant 3

The same starting material as in the case of variant 2 is used. A quick overheating up to 1,200° C. is made followed by quick cooling to 1,050° C.

Figure 5C:
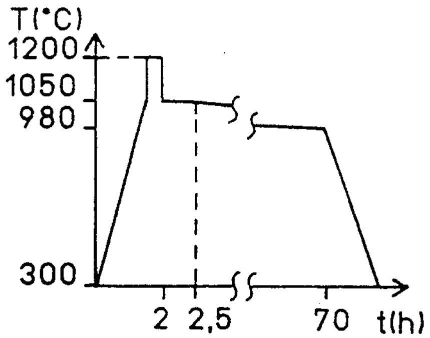

As shown in FIG. 5C, an annealing at 1,050° C. is made under a field of a few teslas for homogenization and orientation. Slow cooling by about 1° C. per hour down to 1,020° C. (not shown) is achieved, then the crucible is moved to the position of the maximum magnetic force and the temperature is slowly decreased from 1,020° C. to 980° C. Then, faster cooling can be made.

A textured solid compound is obtained provided the temperature gradients are properly oriented with respect to the direction of easy magnetization.

EXAMPLE 3

Variant 4

In this case, it is tried to synthesize the superconductor in a liquid flow. For example, it is possible to start from $BaCuO_2$-CuO(BaO 28%, CuO 72% per mole) eutectic.

Figure 5D:
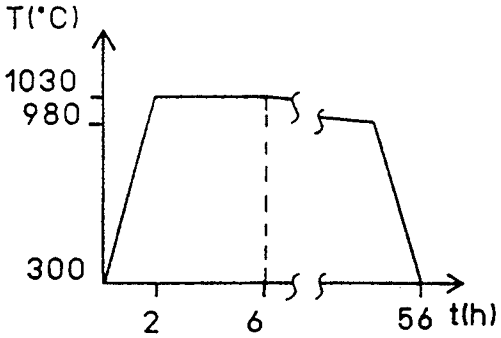

As shown in FIG. 5D, an intimate mixture of 8 $BaCuO_2$+4 CuO+$R_2O_3$ powders is heated at 1,050° C. with a HdH/dz value of about 200 $T^2/m$. Then, the material is cooled down to 980° C. by 1° C. per hour, and more rapidly to normal temperature, afterwards.

A $RBa_2Cu_3O_7$ solid material, textured at the bottom of the crucible, is obtained. The eutectic liquid is maintained in the crucible by the magnetic force. It is solidified above the $RBa_2Cu_3O_7$ superconductor compound. The superconductor can be sawn off from the eutectic as above explained.

Various variants of the method according to the invention have been described; it is clear that other variants will appear to those skilled in the art as long as they implement the basic aspects of the invention, namely:

orienting crystallites of a compound in a liquid phase in the presence of a magnetic field, sedimenting in the presence of a magnetic force, texturizing by application of a determined temperature gradient.

I claim:

1. A method for preparing an oriented and textured magnetic compound, comprising the following steps:
 a) preparing a composition at a temperature such that it comprises crystallites of said compound in the presence of a liquid,
 b) subjecting said composition to a magnetic force having a unidirectional net intensity producing sedimentation of crystallites, and
 c) cooling down said composition in the presence of said magnetic force while applying a suitable temperature gradient for improving the development of a desired texture in the sedimentation area.

2. A method according to claim 1, wherein said magnetic force results from the presence of a magnetic field with a high gradient in the gravity direction and invariant with respect to time.

3. A method according to claim 1, comprising, between steps a) and b), a step of applying a magnetic field with a practically null gradient.

4. A method according to claim 1, wherein the crystallites of step a) originate from single-crystal particles of said desired magnetic compound mixed with a second material, the melting temperature and magnetic susceptibility of which are lower than those of said desired compound, the mixture being heated at a temperature higher than the melting temperature of said second material and lower than, but close to, the melting temperature of said desired magnetic compound.

5. A method according to claim 1, wherein step a) includes starting from said desired magnetic compound in bulk form and heating said compound up to the liquid state, without overheating, so that numerous small-size seeds of the desired compound remain.

6. A method according to claim 1, wherein step a) includes starting from said desired magnetic compound in solid state, then heating said compound at a temperature higher than its melting point and allowing it to slowly cool down until seeds of the compound first appear.

7. A method according to claim 1, wherein step a) includes starting from a mixture of materials comprising solid particles constitutive of said desired magnetic compound but which have not yet reacted, said particles being in suspension in a non-reactive liquid, said mixture being heated at a temperature lower than the melting temperature of said constitutive particles.

8. A method according to claim 1, wherein the oriented and textured magnetic compound comprises NdFeB.

9. A method according to claim 1, wherein the oriented and textured magnetic compound comprises $Sm_2T_{17}$.

10. A method according to claim 1, wherein the oriented and textured magnetic compound comprises $RBa_2Cu_3O_{7-6}$.

* * * * *